US012696740B2

(12) United States Patent
Xiao et al.

(10) Patent No.:  US 12,696,740 B2
(45) Date of Patent:  Jul. 28, 2026

(54) APPARATUS AND METHODS FOR BONDING MATERIALS

(71) Applicant: Applied Materials, Inc., Santa Clara, CA (US)

(72) Inventors: Wen Xiao, San Jose, CA (US); Ming-Jui Li, Sunnyvale, CA (US); Michelle Tjakradinata, San Jose, CA (US); Harish Varma Penmethsa, Dublin, CA (US); Jeffrey Ivan Turner, Kalispell, MT (US)

(73) Assignee: Applied Materials Inc., Santa Clara, CA (US)

( * ) Notice: Subject to any disclaimer, the term of this patent is extended or adjusted under 35 U.S.C. 154(b) by 416 days.

(21) Appl. No.: 18/543,492

(22) Filed: Dec. 18, 2023

(65) Prior Publication Data

US 2025/0201631 A1      Jun. 19, 2025

(51) Int. Cl.
*H10W 20/00*          (2026.01)

(52) U.S. Cl.
CPC .................................. *H10W 20/042* (2026.01)

(58) Field of Classification Search
CPC .................................................. H10W 20/042
See application file for complete search history.

(56) References Cited

U.S. PATENT DOCUMENTS 10,790,209  B2      9/2020  Imayoshi
2006/0240187  A1*  10/2006  Weidman ............ C23C 16/0272
257/E21.174

2010/0101727  A1      4/2010  Ji
2019/0385907  A1    12/2019  Gottheim et al.
2020/0075346  A1      3/2020  Ventzek et al.
2022/0165546  A1      5/2022  Lill et al.
2022/0406568  A1    12/2022  Tamamushi

FOREIGN PATENT DOCUMENTS

WO      WO 2020/112710  A1      6/2020
WO      WO 2022/066407  A1      3/2022

OTHER PUBLICATIONS

International Search Report for PCT/US2024/059942, dated Apr. 2, 2025.

* cited by examiner

*Primary Examiner* — J. E. Schoenholtz
(74) *Attorney, Agent, or Firm* — Moser Taboada

(57)          ABSTRACT

A method for preparing a surface for bonding leverages multiple treatment processes to increase bonding strength. The method may include performing a first treatment process on a surface of a material using a first plasma process to promote diffusion into the first surface of a diffusion layer deposited after the first treatment process where the first treatment process uses capacitively coupled plasma (CCP) or a combination including both CCP and inductively coupled plasma (ICP) simultaneously, forming the diffusion layer on the surface of the material, performing a second treatment process using a second plasma process to increase diffusion of the diffusion layer into the surface of the material where the second treatment process uses CCP, and performing a third treatment process using a third plasma process to form dangling bonds on the diffusion layer where the third treatment process uses ICP or a combination including both CCP and ICP simultaneously.

20 Claims, 9 Drawing Sheets

APPARATUS AND METHODS FOR BONDING MATERIALS

FIELD

Embodiments of the present principles generally relate to semiconductor processing of semiconductor substrates.

BACKGROUND

In semiconductor manufacturing, many processes require that materials be bonded together. Poor bonds between the materials result in delamination which can lead to poor performance of devices, causing reduced reliability and yields. To circumvent poor surface bonding, an adhesion layer may be incorporated between the two materials. The inventors have observed, however, that the adhesion layer bonding strength is often very low, leading to bonding failures, especially after thermal cycling. Attempts to increase the bonding strength, such as the use of high temperatures for diffusion enhancement, are often not feasible for low thermal budget components.

Accordingly, the inventors have provided apparatus and methods for improving the bonding strength between materials while maintaining compatibility with low thermal budgets.

SUMMARY

Methods and apparatus for improving bonding performance of materials while maintaining low thermal budgets are provided herein.

In some embodiments, a method for preparing a surface for bonding may comprise performing a first treatment process on a first surface of a first material using a first plasma process to promote diffusion into the first surface of a first diffusion layer deposited after the first treatment process where the first treatment process uses capacitively coupled plasma (CCP) or a combination including both CCP and inductively coupled plasma (ICP) simultaneously, forming the first diffusion layer on the first surface of the first material, performing a second treatment process using a second plasma process to increase diffusion of the first diffusion layer into the first surface of the first material where the second treatment process uses CCP, and performing a third treatment process using a third plasma process to form dangling bonds on the first diffusion layer where the third treatment process uses ICP or a combination including both CCP and ICP simultaneously.

In some embodiments, the method may further include a first material that is rotated about a vertical axis during the first treatment process or the third treatment process; a first plasma process that forms plasma using an argon-based gas, a nitrogen-based gas, an oxygen-based gas, a hydrogen-based gas, a fluorocarbon ($C_xF_y$)-based gas, or nitrogen fluoride ($NF_x$)-based gas; a first treatment process, a second treatment process, and a third treatment process that each have a duration of approximately 30 seconds to approximately 5 minutes; a first treatment process that uses approximately 1 kW to approximately 3 kW power when CCP is used and approximately 100 W to approximately 10 kW source power when ICP is used; a first diffusion layer that is formed using a physical vapor deposition (PVD) process, an atomic layer deposition (ALD) process, a chemical vapor deposition (CVD) process, a thermal evaporation process, or an e-beam evaporation process; a first diffusion layer that is formed using a source power of approximately 5 kW to approximately 60 kW at a pressure of approximately 0.5 mTorr to approximately 10 mTorr; a first diffusion layer that has a thickness of approximately 0.5 nm to approximately 5 nm; a first diffusion layer that is a molybdenum-based material, a titanium-based material, a tantalum-based material, a cobalt-based material, a tungsten-based material, a copper-based material, a silicon-based material, a nitride-based material, a silicide-based material, or a carbide-based material; a second plasma process or a third plasma process that forms plasma using an argon-based gas, a nitrogen-based gas, an oxygen-based gas, or a hydrogen-based gas; a second treatment process that is performed with a power of approximately 1 kW to approximately 3 kW at a pressure of approximately 0.5 mTorr to approximately 10 mTorr; a third treatment process that is performed with a source power of approximately 100 W to approximately 10 kW at a pressure of approximately 0.5 mTorr to approximately 20 mTorr; a seed layer that is formed directly on the first diffusion layer after the third treatment process or an adhesion layer that is first formed on the first diffusion layer after the third treatment process and then a seed layer is formed on the adhesion layer; repeating the method on a second material which is then bonded to the first material with the first diffusion layer and a second diffusion layer on the second material as intermediate layers between the first material and the second material bonded together; a first material that is a glass-based material and the method is performed on a through glass via (TGV) in the glass-based material; and/or the method performed in a single process chamber, an integrated tool, or in separate process chambers.

In some embodiments, a non-transitory, computer readable medium having instructions stored thereon that, when executed, cause a method for preparing a surface for bonding to be performed, the method may comprise performing a first treatment process on a first surface of a first material using a first plasma process to promote diffusion into the first surface of a first diffusion layer deposited after the first treatment process where the first treatment process uses capacitively coupled plasma (CCP) or a combination including both CCP and inductively coupled plasma (ICP) simultaneously, forming the first diffusion layer on the first surface of the first material, performing a second treatment process using a second plasma process to increase diffusion of the first diffusion layer into the first surface of the first material where the second treatment process uses CCP, and performing a third treatment process using a third plasma process to form dangling bonds on the first diffusion layer where the third treatment process uses ICP or a combination including both CCP and ICP simultaneously.

In some embodiments, the method on the non-transitory, computer readable medium may further include a first plasma process that forms plasma using an argon-based gas, a nitrogen-based gas, an oxygen-based gas, a hydrogen-based gas, a fluorocarbon ($C_xF_y$)-based gas, or nitrogen fluoride ($NF_x$)-based gas; a first treatment process, a second treatment process, and a third treatment process that each have a duration of approximately 30 seconds to approximately 5 minutes; a first treatment process that uses approximately 1 kW to approximately 3 kW power when CCP is used and approximately 100 W to approximately 10 kW source power when ICP is used; a diffusion layer that has a thickness of approximately 0.5 nm to approximately 5 nm; a diffusion layer that is a molybdenum-based material, a titanium-based material, a tantalum-based material, a cobalt-based material, a tungsten-based material, a copper-based material, a silicon-based material, a nitride-based material, a silicide-based material, or a carbide-based material; a second plasma process or a third plasma process that forms plasma using an argon-based gas, a nitrogen-based gas, an oxygen-based gas, or a hydrogen-based gas; a second treatment process that is performed with a power of approximately 1 kW to approximately 3 kW at a pressure of approximately 0.5 mTorr to approximately 10 mTorr; and/or a third treatment process that is performed with a source power of approximately 100 W to approximately 10 kW at a pressure of approximately 0.5 mTorr to approximately 20 mTorr.

In some embodiments, an apparatus for preparing a surface for bonding may comprise a process chamber with a rotating substrate support, a process volume enclosed by an upper process shield, a lower process shield, and a rotatable top shield, and multiple selectable cathodes positioned on top of the process chamber which are connected to a dual-power type target power supply configured to produce RF power or DC power or pulsed DC power where one cathode position is an inductively coupled plasma (ICP) source, a dual-power power supply electrically connected to an electrode in the rotating substrate support and configured to generate capacitively coupled plasma (CCP) within the process volume, the ICP source includes a dual-power power supply that is electrically connected to an antenna and configured to generate ICP within the process volume where the antenna is positioned to be exposed to the process volume by rotating the rotatable top shield, and a controller configured to rotate the rotatable top shield to select a cathode for deposition or the antenna for ICP generation within the process volume and to perform a method including performing a first treatment process on a surface of a material using a first plasma process to promote diffusion into the surface of a diffusion layer deposited after the first treatment process where the first treatment process uses CCP or a combination including both CCP and ICP simultaneously, forming the diffusion layer on the surface of the material, performing a second treatment process using a second plasma process to increase diffusion of the diffusion layer into the surface of the material where the second treatment process uses CCP, and performing a third treatment process using a third plasma process to form dangling bonds on the diffusion layer where the third treatment process uses ICP or a combination including both CCP and ICP simultaneously.

In some embodiments, the apparatus may further include a dual-power power supply that includes a first RF power source with a first frequency of approximately 60 MHz and a second RF power source with a second frequency of approximately 2 MHz.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figures 1, 2:
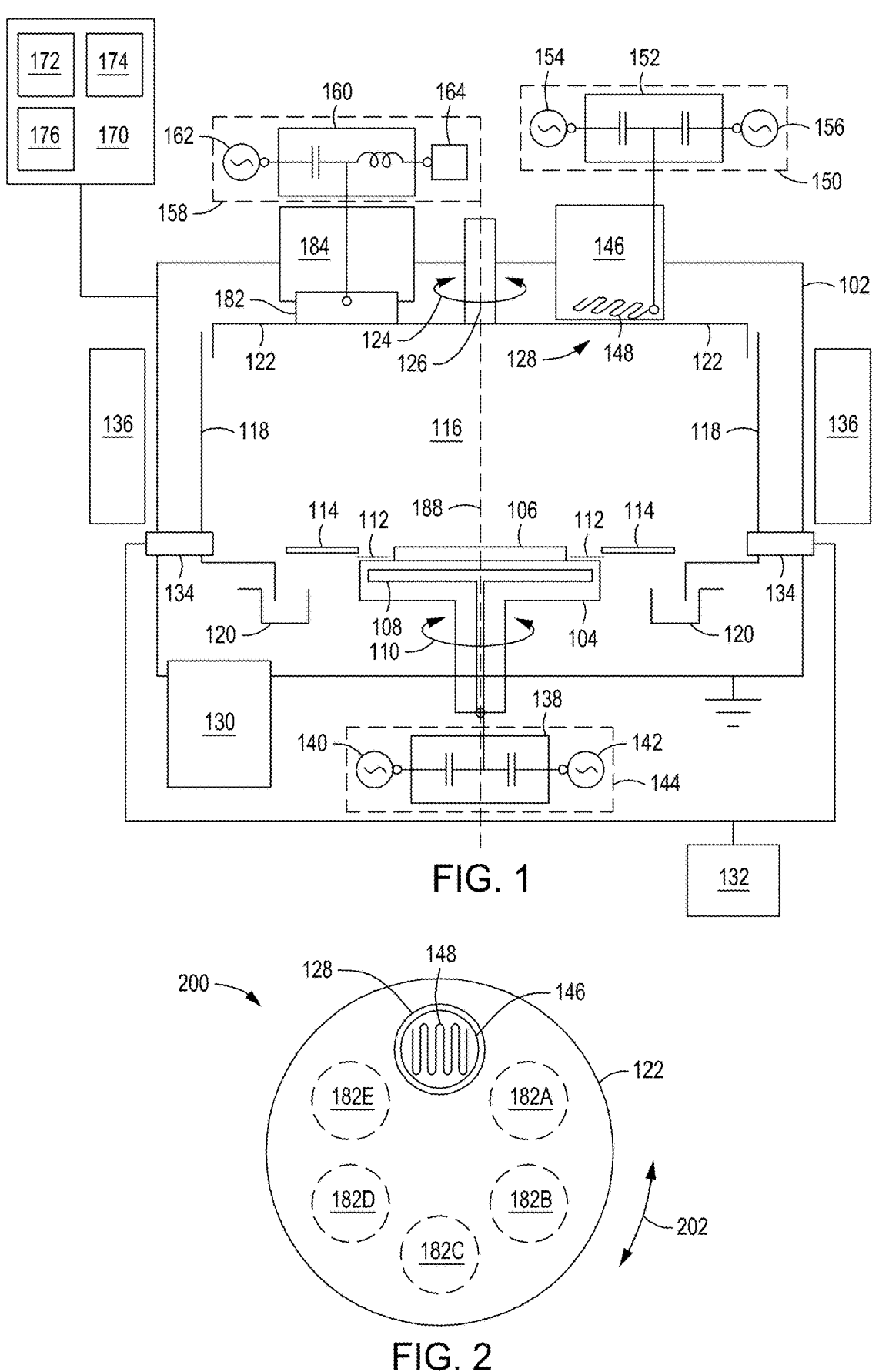
FIG. 1 depicts a cross-sectional view of a process chamber with bonding surface treatment capabilities in accordance with some embodiments of the present principles.
FIG. 2 depicts a bottom-up view of a top shield and cathode assembly configuration in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide improved bonding performance between similar and dissimilar materials. The techniques enhance the bonding processes by using an intermediate layer of augmented diffusion layers and/or adhesion layers positioned between the two materials. The intermediate layers of the present techniques bond the two materials with a bonding strength of over 600 percent higher than with traditional processes. The increased bonding strength also improves the reliability of the components by reducing performance degradation due to delamination of the materials after thermal cycling. The present techniques boost bonding performance without increasing roughness of the bonded surfaces, thereby, improving signal integrity and power integrity for high frequency applications, such as, but not limited to, data center applications, 5G base station applications, and the like. The enhanced bonding process can be utilized with any materials, such as but not limited to, glass-to-metal bonding, glass-to-glass bonding, and/or hybrid bonding, etc. and easily adjusted based on the bonded materials. The present processes can be performed in multiple chambers, a specialized surface treatment chamber, or in an integrated chamber. The present techniques can be used for substrate-to-substrate, die-to-die, die-to-substrate and/or through via bonding such as, but not limited to, through-glass via (TGV) material bonding. The techniques may also be used for interposer bonding between substrates and similar.

Traditional bonding processes attempt to improve adhesion between materials by increasing interface roughness via technologies such as glass polishing and wet chemistry-based etching, which causes signal integrity loss and additional power consumption. The present techniques utilize a vacuum-based plasma apparatus to improve adhesion by increasing a first material-to-diffusion layer bonding strength at the interface and increasing a diffusion layer-to-a second material bonding strength by surface activation of the diffusion layer. The present processes and apparatus allow enhancement of the adhesion strength between similar and dissimilar materials and is compatible with current processes such as, for example, glass metallization processes used in forming TGVs and hybrid bonding processes using dielectric materials and/or conductive materials. In some embodiments, the adhesion promotion process may include a surface treatment to enhance a subsequent diffusion layer formation, formation of the diffusion layer on the treated surface, a further diffusion enhancement treatment of the diffusion layer, and a surface activation of the diffusion layer to form dangling bonds on the diffusion layer surface. The enhanced adhesion processes increase reliability of TGV metallization, increase adhesion between an adhesion layer and a material such as, but not limited, glass and the like, reduce peeling and delamination that may occur between the adhesion layer and the material when subjected to stress build-up, thermal cycling, and/or moisture, and the like.

Figure 14:
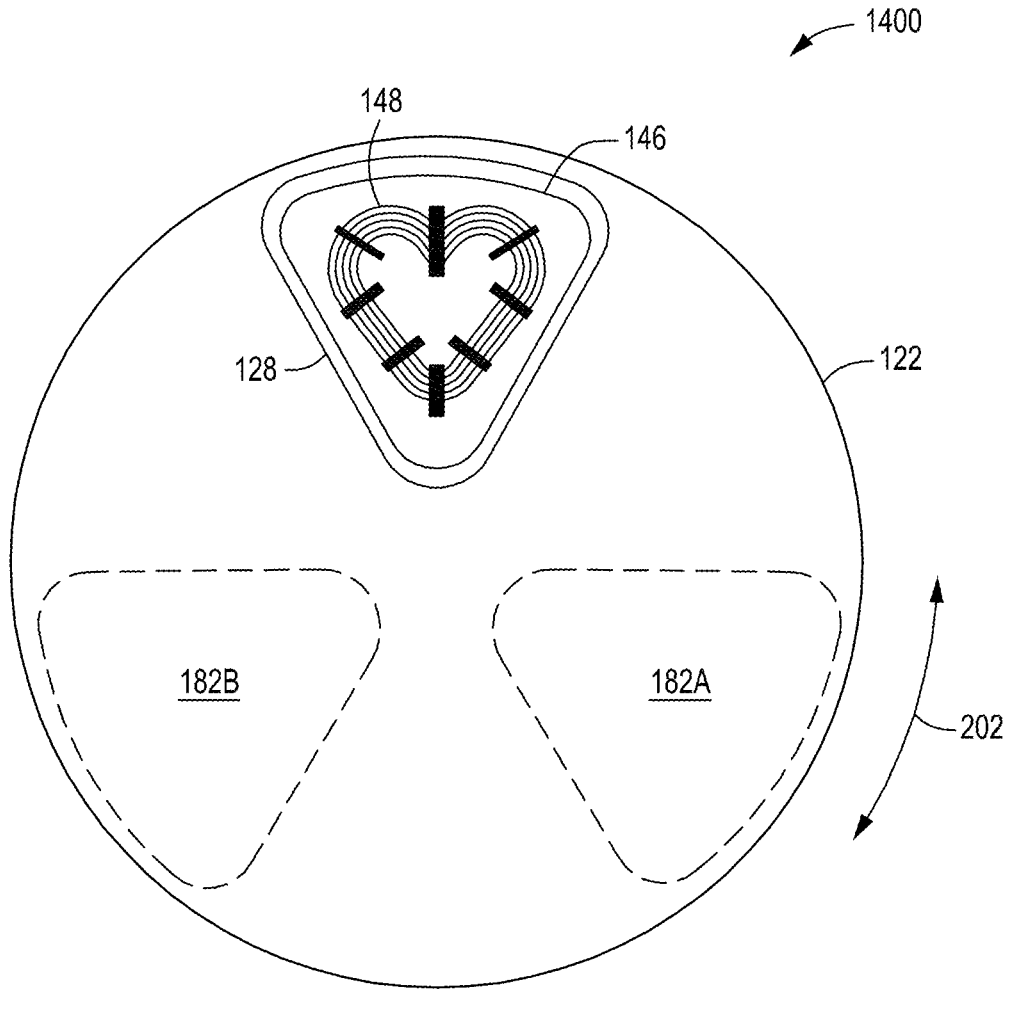
FIG. 14 depicts a bottom-up view of an alternative top shield and cathode assembly configuration in accordance with some embodiments of the present principles.

The present methods may be performed in standalone chambers, in separate chambers of an integrated tool (e.g., integrated tool 1200 of FIG. 12), or in a surface preparation chamber with inductively coupled plasma (ICP) and capacitively coupled plasma (CCP) capabilities along with sputtering deposition capabilities such as, for example, in the process chamber 100 of FIG. 1. The process chamber 100 provides the capability to complete all surface treatments and diffusion layer formations in a single chamber. The process chamber 100 has a chamber body 102 that is electrically grounded and provides a process volume 116 for processing a substrate 106 on a substrate support 104. The process volume 116 is enclosed by a process kit that includes a lower shield 120, and upper shield 118, and a top shield 122 that are electrically grounded. The top shield 122 is rotatable 124 about a vertical axis 188 via a central shaft 126. The top shield 122 has an opening 128 that is used to select a cathode or ICP source and to shutter other sources/cathodes for protection during processing (see, e.g., FIGS. 2 and 14).

A pumping system 130 provides a vacuum in the process volume 116 for processing of the substrate 106. In some embodiments, the pumping system 130 can provide a pressure in the process volume 116 of approximately 0.5 mTorr to approximately 20 mTorr. Electromagnets 136 that surround the chamber body 102 are configured to tune the plasma shape for more uniform film deposition onto the substrate 106. A gas supply 132 is fluidly connected to the process volume 116 via gas diffusers 134. The gas supply 132 may be configured to contain multiple gases that are controllable by a system controller 170 during processing of the substrate 106. In some embodiments, the gas supply 132 may supply one or more gases such as, but not limited to, argon, nitrogen, oxygen, hydrogen, methane ($CH_4$), carbon dioxide ($CO_2$), fluorocarbons ($C_xF_y$), nitrogen fluorides ($NF_x$), and/or sulfur fluorides ($S_xF_y$), and the like.

The substrate support 104 is surrounded by a cover ring 112 and a deposition ring 114 outboard of the cover ring 112. The substrate support 104 can be rotated 110 about the vertical axis 188 during processing of the substrate 106 to allow for more uniform surface treatments and/or depositions when ICP is used for plasma generation in the process volume 116. The substrate support 104 has an embedded plasma electrode 108 for generating CCP plasma within the process volume 116. The embedded plasma electrode 108 is electrically connected to a CCP power supply 144 and generates an electromagnetic field in proximity of the substrate 106. The CCP power supply 144 includes a first match network 138 that is electrically connected to a first RF power supply 140 and a second RF power supply 142. The first RF power supply 140 and the second RF power supply 142 may operate at the same frequency or at different frequencies. In some embodiments, the CCP power supply 144 may use a high frequency RF to provide a high plasma density in the process volume 116 and simultaneously use a low frequency RF simultaneously to increase plasma energy in the process volume 116. In some embodiments, the first RF power supply 140 may operate at 60 MHz and the second RF power supply 142 may operate at 2 MHz. The CCP power supply 144 is used to capacitively generate plasma within the process volume 116 between the embedded plasma electrode 108 and the grounded chamber body 102 and process shield kit. In some embodiments, the CCP power supply 144 may generate approximately 1 kilowatt to approximately 2 kilowatts of power.

The process chamber 100 includes a plurality of cathode assemblies 184 for a plurality of targets 182, respectively. Each of the cathode assemblies 184 may be electrically connected to a sputtering power supply 158. The sputtering power supply 158 includes a second match network 160 that may be electrically connected to an RF sputtering power supply 162 and/or to a DC sputtering power supply 164. The DC sputtering power supply 164 may provide a constant DC power and/or a pulsing DC power to the cathode assemblies 184 and targets 182. In some embodiments, the RF sputtering power supply 162 may operate at, but not limited to, a frequency of 13.56 MHz and the like. The targets 182 may be metallic or non-metallic. Metallic targets use DC power for sputtering. Non-metallic targets use RF power for sputtering. In some embodiments, one or more of the positions of the plurality of cathode assemblies 184 may be replaced with an ICP source 146 that includes an antenna 148. In some embodiments, the antenna 148 may be a planar-type coil or a cylindrical-type coil and the like. The ICP source 146 may be electrically connected to an ICP power source 150 that includes a match network 152 electrically connected to a first RF ICP power supply 154 and a second RF ICP power supply 156. The first RF ICP power supply 154 and the second RF ICP power supply 156 may operate at the same frequency and/or at different frequencies. The ICP source 146 generates inductively coupled plasma within the process volume 116. In some embodiments, the ICP power source 150 may provide approximately 100 watts to approximately 5 kilowatts of power. In some embodiments, the substrate support 104 is rotated when the inductively coupled plasma is generated within the process volume 116 due to the offset ICP source 146 (offset relative to the vertical axis 188 through the substrate support 104). In some embodiments, both the ICP power source 150 and the CCP power supply 144 may operate simultaneously.

The process chamber 100 may also include the system controller 170 that controls the operation of the process chamber 100 using a direct control or alternatively, by controlling the computers (or controllers) associated with the process chamber 100. In operation, the system controller 170 enables data collection and feedback from the process chamber 100 to optimize performance of the process chamber 100. The system controller 170 generally includes a Central Processing Unit (CPU) 172, a memory 174, and a support circuit 176. The CPU 172 may be any form of a general-purpose computer processor that can be used in an industrial setting. The support circuit 176 is conventionally coupled to the CPU 172 and may comprise a cache, clock circuits, input/output subsystems, power supplies, and the like. Software routines, such as methods as described below may be stored in the memory 174 and, when executed by the CPU 172, transform the CPU 172 into a specific purpose computer (system controller 170). The software routines may also be stored and/or executed by a second controller (not shown) that is located remotely from the process chamber 100.

The memory 174 is in the form of computer-readable storage media that contains instructions, when executed by the CPU 172, to facilitate the operation of the semiconductor processes and equipment. The instructions in the memory 174 are in the form of a program product such as a program that implements the methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

FIG. 2 is a bottom-up view 200 of the top shield 122. In the example depicted in FIG. 2, the top shield 122 has been rotated such that the opening 128 exposes the ICP source 146 while the plurality of available targets 182A-E are covered or shuttered by the top shield 122. During depositions, the top shield 122 can be rotated 202 such that the opening 128 in the top shield 122 exposes one of the plurality of available targets 182A-E as needed. The target material composition may be the same or different for the plurality of available targets 182A-E. Target material, for the diffusion layer formation, may include, but is not limited to, molybdenum-based material, titanium-based material, tantalum-based material, cobalt-based material, tungsten-based material, copper-based material, silicon-based material, alloys thereof, nitride-based material, silicide-based material, and/or carbide-based material, and the like. The ICP source 146 is offset in the chamber and plasma generation density may vary across the process volume 116. To provide a more uniform treatment of the substrate 106, the substrate support 104 may be rotated to evenly expose surfaces of the substrate 106 to the inductively coupled plasma (see FIG. 1). In some embodiments, the top shield 122, the cathode assemblies 184, the targets 182, and the ICP source 146 of the chamber body 102 may be in an alternative configuration and shapes as depicted in a view 1400 of FIG. 14. Fewer cathode assemblies 182A, 182B are used in conjunction with the ICP source 146 with antenna 148.

"Bonding strength" or "adhesion strength" may be used interchangeably herein. The bonding or adhesion strength refers to the strength required to physically separate two joined materials. The two materials may be the same or different materials. The bonding may occur through direct physical contact, through chemical interaction, or through deposition of one material onto the other. Bonding other materials to, for example, glass with a high adhesion strength is particularly difficult to achieve. For brevity, examples herein may be based on bonding metal materials to glass, but the bonded metal materials-to-glass are not meant to be limiting. The present methods may be used to enhance the bonding strength between any types of materials or between the same types of materials.

The proliferation of mobile devices and the Internet of Things (IoT) leads to increasingly difficult requirements in RF communications. More frequency bands have been introduced with higher frequencies that also need power loss minimization for frequencies in the gigahertz range. There has been a substantial effort to extend interposer technology for 2.5D or 3D-IC stacking by utilizing glass substrates for advanced packaging. Glass has an adjustable dielectric constant, high resistivity, and low electrical loss, especially at high frequencies. Glass has a relatively high stiffness and the ability to adjust the coefficient of thermal expansion (CTE) allowing warpage management in glass core substrates for through-glass via applications. Glass forming processes allow the potential to form both in panel format as well at thicknesses as low as 100 μm. Glass forming processes available today enable reduction or elimination of time consuming and costly thinning or polishing processes, making glass cost effective as substrates. Glass is impervious to conductive anodic filament (CAF) formation (a failure mechanism in organic core substrate).

Glass via/surface metallization is critical for applications of glass core substrates and TGV. Glass substrates allow through-glass vias without using a barrier or additional dielectric layer in the TGVs prior to the metallization process. However, the reliability of the TGVs is questionable due to the weak adhesion between the adhesion layer and the glass. The inventors have found that peeling and delamination occur between the adhesion layer and glass when subjected to stress buildup, thermal cycling, and moisture attacks, etc. Thus, the inventors have found that increasing the adhesion strength to glass is critical for the acceptance of glass core substrates in semiconductor manufacturing. Prior attempts to increase adhesion through roughening of surfaces led to degraded signal integrity. Further prior attempts to increase interface diffusion by subjecting the glass to high temperatures of 450 degrees Celsius and beyond are not compatible with low thermal budget semiconductor devices. Adding additional adhesion layers leads to increased system complexity and higher costs with reduced throughput.

The present methods provide enhanced bond/adhesion strength between materials such as, but not limited to, metal and glass via interface engineering. In the example case of glass, the film/glass diffusion layer at the interface is increased as well as the film/glass bonding by surface activation. The methods may include promoting the diffusion layer and adding dangling bond formation on glass and other surfaces to enhance film/glass or film/material adhesion for glass and other material metallization (e.g., substrate core with TGV). The techniques of the present methods keep the interface roughness low, providing high signal integrity and power integrity for package devices. The resulting material interface yields high bond/adhesion strength with low roughness (e.g., Ra less than approximately 0.3 nm), low temperature interface diffusion (e.g., temperatures of less than approximately 150 degrees Celsius, no high temperature annealing for diffusion layer enhancements is used), and the capability to bond materials in one process chamber (see FIG. 1), allowing for increased performance and throughput while being cost effective.

Figure 3:
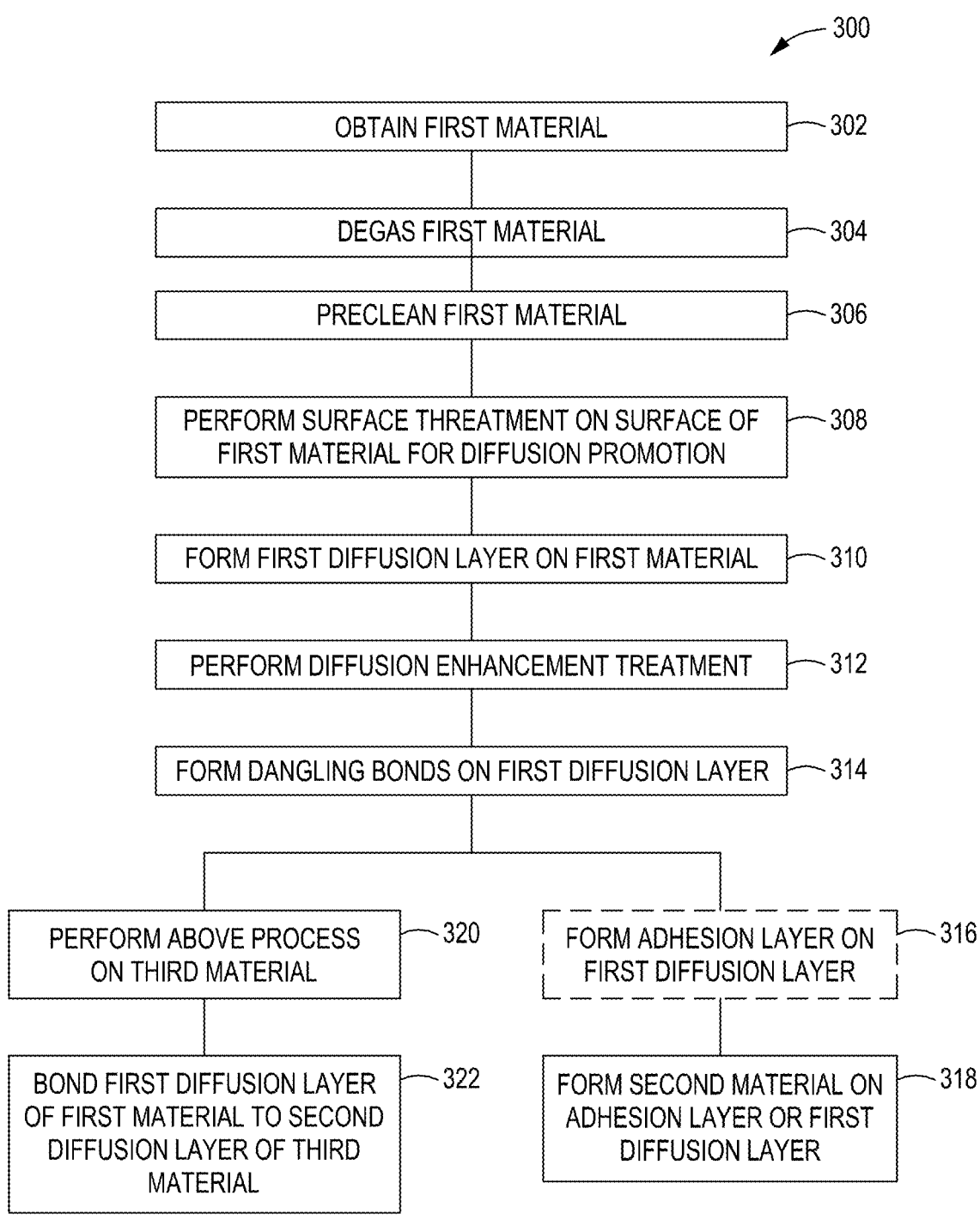
FIG. 3 is a method of preparing a surface for bonding in accordance with some embodiments of the present principles.

In brief, the surface preparation for bonding includes a surface treatment for diffusion prior to formation of a diffusion layer, formation of the diffusion layer, a diffusion enhancement treatment, and a dangling bond formation treatment via surface activation. The methods are compatible with many material types and substantially improve the reliability of, for example, package-on-substrate devices, especially glass-based devices for high frequency communications and the like. The method 300 of FIG. 3 provides a process in which to prepare surfaces for bonding whether the bonding is to a deposited layer (e.g., seed layer in a TGV, etc.) or physical bonding between materials by contact or under compression (e.g., substrate-to-substrate bonding, die-to-substrate bonding, die-to-die bonding, bonded stacks of dies or substrates). References to FIG. 4 may be made in discussing the method 300. In block 302, a first material 402 is provided as depicted in a view 400A of FIG. 4. The first material may be in the form of a substrate, a die, or other structure. In some embodiments, the first material may be glass or other dielectric material. In some embodiments, in block 304, an optional degas process may be performed on the first material to remove any moisture and the like. In block 306, an optional preclean process may also be performed on the first material if desired in preparation for the surface preparation for bonding. The preclean process removes surface contamination. In some embodiments, argon may be used to sputter the material surface to clean the surface. The degas and precleaning can be used to ensure the material is moisture-free and particle-free before treating the surface for bonding.

In block 308, a first treatment process 404 is performed on the first material 402 to treat the surface to promote diffusion of a subsequently deposited diffusion layer using a first plasma process as depicted in a view 400B of FIG. 4. The first treatment process 404 reduces the density of the surface of the first material 402 making the surface more conducive to accepting a diffusion layer without increasing the surface roughness of the first material 402. The first treatment process 404 uses capacitively coupled plasma or a combination (increases plasma density to increase process speed) of capacitively coupled plasma and inductively coupled plasma. If the process chamber 100 of FIG. 1 is used, the substrate support 104 is rotated 110 around the vertical axis 188 during the process when ICP is incorporated into the first treatment process 404 to promote a uniform treatment over the surface. In some embodiments, the first plasma process forms plasma using an argon-based gas, a nitrogen-based gas, an oxygen-based gas, a hydrogen-based gas, a fluorocarbon ($C_xF_y$)-based gas, or a nitrogen fluoride ($NF_x$)-based gas.

In some embodiments, a reactive gas is used to cause a chemical reaction with the surface of the first material to promote diffusion. In some embodiments, the first treatment process 404 has a duration of approximately 30 seconds to approximately 5 minutes. In some embodiments, the first treatment process 404 may use approximately 1 kW to approximately 3 kW of CCP power (e.g., CCP power supply 144 of FIG. 1) when CCP is used and approximately 100 W to approximately 10 kW ICP power (e.g., ICP power source 150 of FIG. 1) when ICP is used. The CCP power uses a high frequency RF power supply (e.g., first RF power supply 140 of FIG. 1) to provide a high plasma density and uses a low frequency RF power supply (e.g., second RF power supply 142) simultaneously to increase plasma energy to treat the surface more efficiently. In some embodiments, the high frequency RF power supply may operate at 60 MHz and the low frequency RF power supply may operate at 2 MHz.

Figure 4:
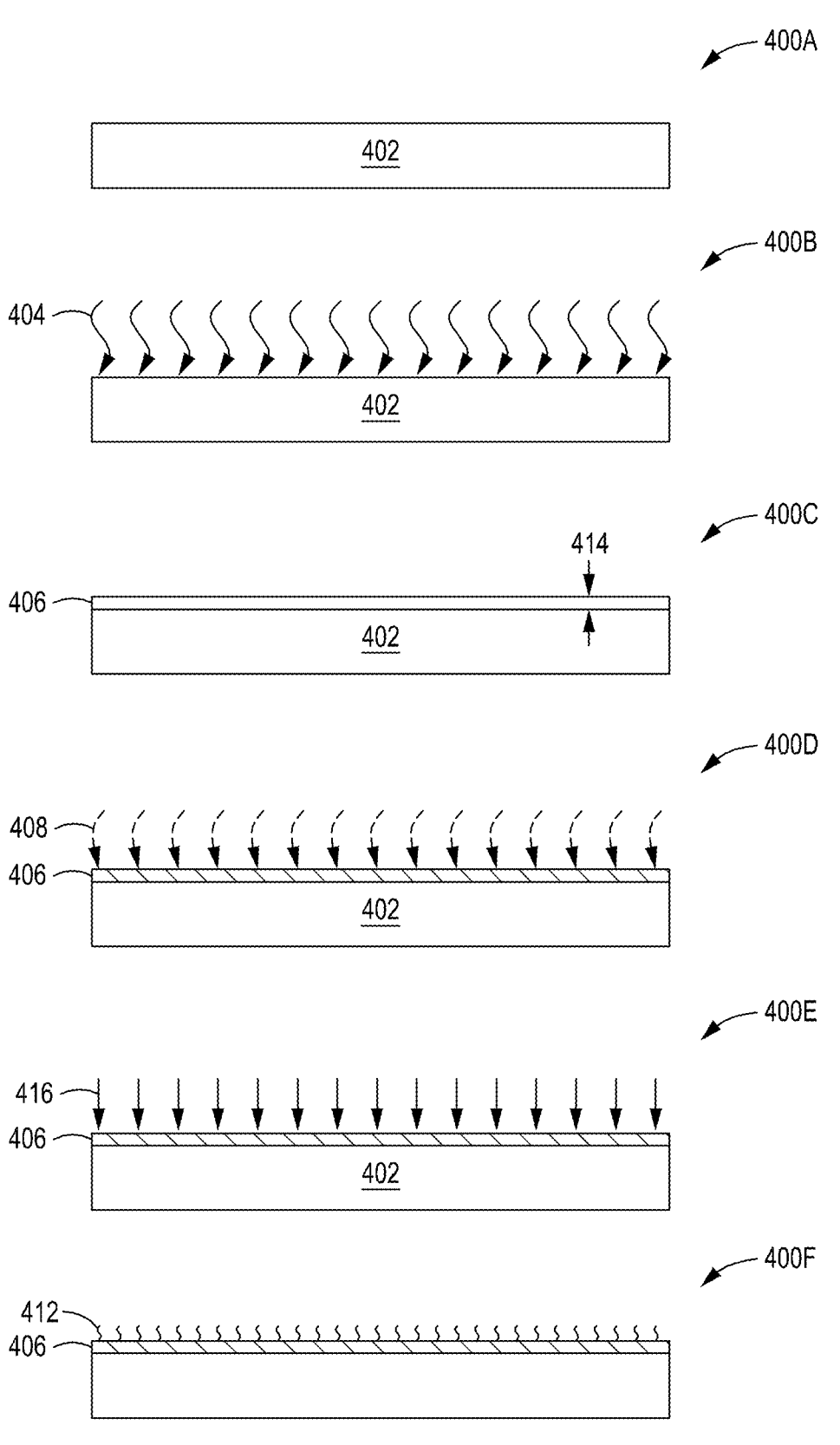
FIG. 4 depicts a cross-sectional view of a surface undergoing treatments and diffusion layer formation in accordance with some embodiments of the present principles.

In block 310, a first diffusion layer 406 is formed on the treated surface of the first material 402 as depicted in a view 400C of FIG. 4. The first diffusion layer 406 may be the same material as a later deposited adhesion layer or different from the later deposited adhesion layer. The first diffusion layer 406 provides a transition between the first material 402 and subsequently deposited material or other materials bonded to the first material. The first diffusion layer 406 may be formed using a physical vapor deposition (PVD) process, an atomic layer deposition (ALD) process, a chemical vapor deposition (CVD) process, a thermal evaporation process, or an e-beam evaporation process and the like. In some embodiments, the first diffusion layer 406 is formed using a sputtering source power (e.g., sputtering power supply 158 of FIG. 1) of approximately 5 kW to approximately 60 kW at a pressure of approximately 0.5 mTorr to approximately 10 mTorr. In some embodiments, the first diffusion layer 406 may be a molybdenum-based material, a titanium-based material, a tantalum-based material, a cobalt-based material, a tungsten-based material, a copper-based material, a silicon-based material, a nitride-based material, a silicide-based material, or a carbide-based material and the like.

In some embodiments, the first diffusion layer 406 introduces some metal material into the first material 402 which may be predominantly dielectric. In some embodiments, the first diffusion layer 406 may introduce a dielectric material into the first material 402, such as, but not limited to, silicon and the like. In some embodiments, the first diffusion layer 406 may have a thickness 414 of approximately 0.5 nm to approximately 5 nm. The thicker the first diffusion layer 406, the less second material that may deposited at a later point in a process such as for a TGV. The TGV has limited volume in which the seed layer is to be formed. A thick diffusion layer would reduce the volume that the seed layer can occupy. In addition, a thick diffusion layer would be more prone to breaking apart internally than a thinner diffusion layer, leading to a reduction in bonding strength (the diffusion layer becomes a weak point in the bond). If the first diffusion layer 406 is too thin, the first diffusion layer 406 will not have sufficient thickness to cover the surface in order to enable adequate bonding strength to the bonding interface.

In block 312, a second treatment process 408 is performed on the first material 402 to further diffuse the first diffusion layer 406 into the first material 402 using a second plasma process as depicted in a view 400D of FIG. 4. The second treatment process 408 uses capacitively coupled plasma. In some embodiments, the second plasma process forms plasma using an argon-based gas, a nitrogen-based gas, an oxygen-based gas, and/or a hydrogen-based gas. In some embodiments, the second treatment process 408 has a duration of approximately 30 seconds to approximately 5 minutes. In some embodiments, the second treatment process 408 may use approximately 1 kW to approximately 3 kW of CCP power and a process pressure of approximately 0.5 mTorr to approximately 10 mTorr. The CCP power uses a high frequency RF power supply to provide a high plasma density and uses a low frequency RF power supply simultaneously to increase plasma energy to treat the surface more efficiently. In some embodiments, the high frequency RF power supply may operate at 60 MHz and the low frequency RF power supply may operate at 2 MHz. The second treatment process 408 is used to further diffuse the first diffusion layer 406 into the first material.

In block 314, a third treatment process 416 is performed on the first diffusion layer 406 to form dangling bonds 412 via surface activation using a third plasma process as depicted in a view 400E and 400F of FIG. 4. The third treatment process 416 uses inductively coupled plasma or inductively coupled plasma combined simultaneously with capacitively coupled plasma. If the process chamber 100 of FIG. 1 is used, the substrate support 104 is rotated 110 around the vertical axis 188 during the third treatment process 416 to promote a uniform treatment over the surface when inductively coupled plasma is used in the third treatment process. In some embodiments, the third plasma process forms plasma using an argon-based gas, a nitrogen-based gas, an oxygen-based gas, or a hydrogen-based gas. In some embodiments, the third treatment process 416 has a duration of approximately 30 seconds to approximately 5 minutes. In some embodiments, the third treatment process 416 may use approximately 100 W to approximately 10 kW of ICP power and a process pressure of approximately 0.5 mTorr to approximately 20 mTorr. The third treatment process 416 is used to form dangling bonds 412 that have increased bonding strength with other similarly treated surfaces or to subsequently formed adhesion layers. In addition, the third treatment process 416 further reduces the water contact angle (WCA) of the surface after the second treatment process 408 by approximately 5 degrees or more.

Figure 5:
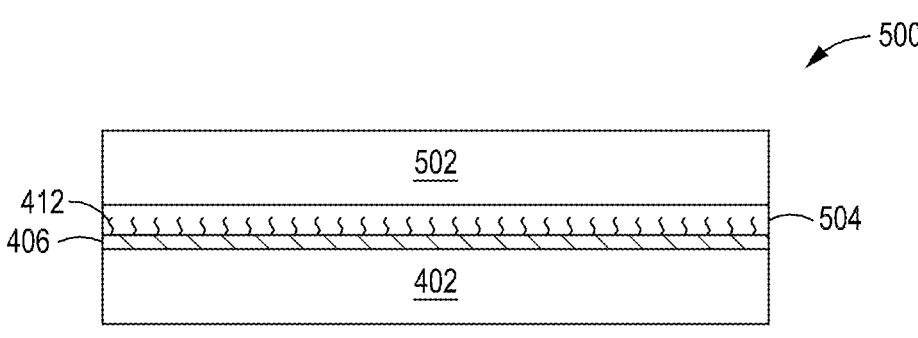
FIG. 5 depicts a cross-sectional view of a deposition of a material onto a treated surface with an adhesion layer in accordance with some embodiments of the present principles.
Figure 6:
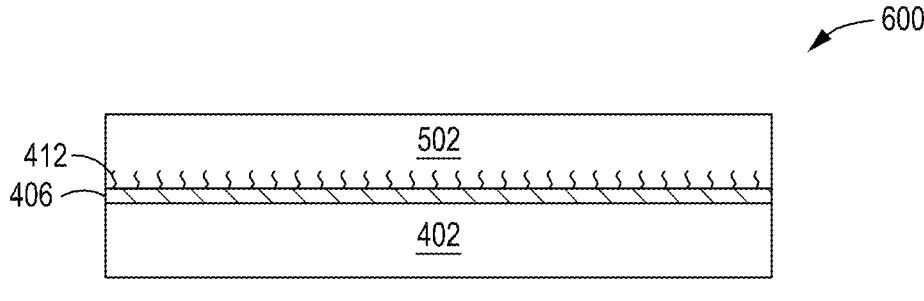
FIG. 6 depicts a cross-sectional view of a deposition of a material onto a treated surface in accordance with some embodiments of the present principles.
Figure 8:
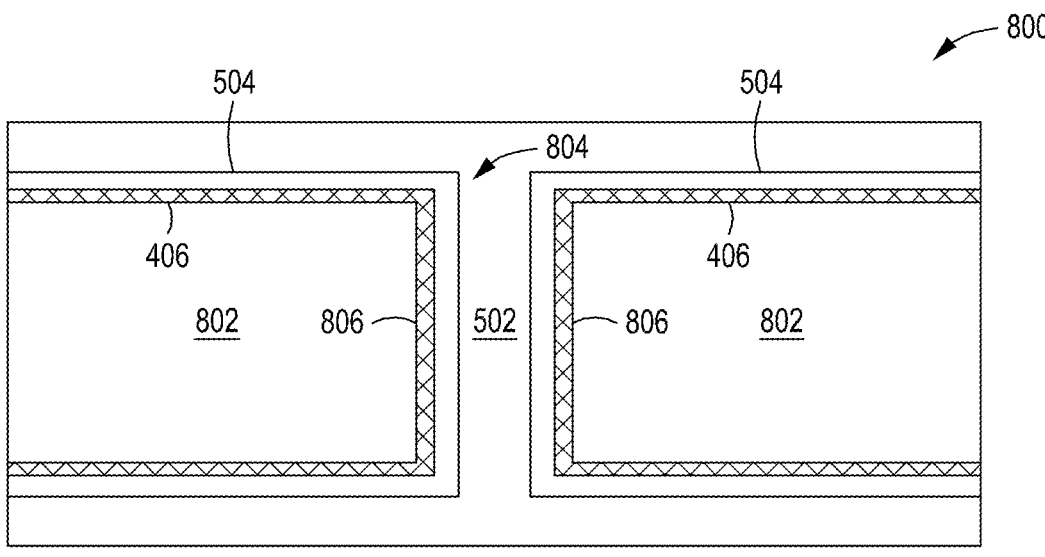
FIG. 8 depicts a cross-sectional view of a glass substrate with a through-glass via with a surface treatment and an adhesion layer in accordance with some embodiments of the present principles.
Figure 9:
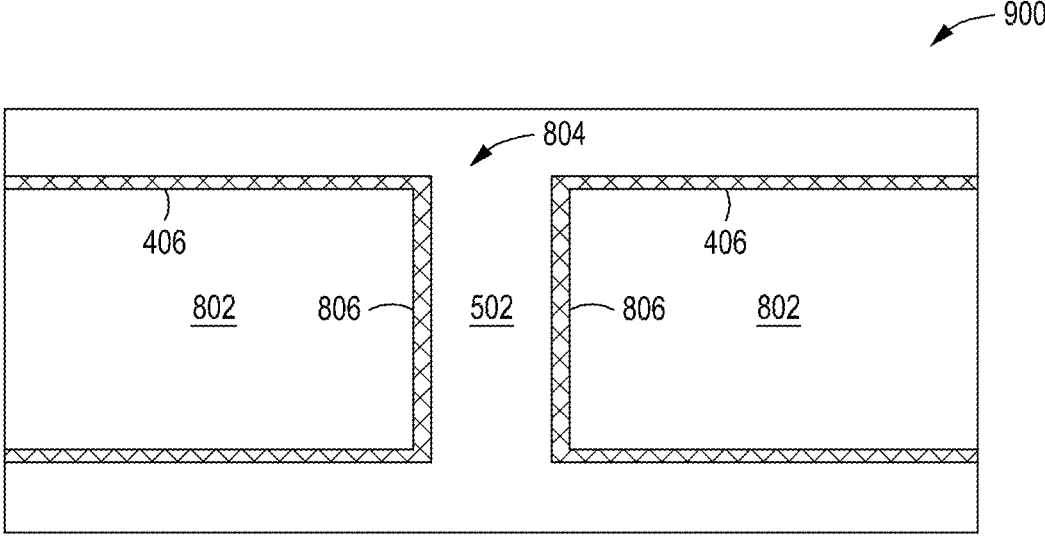
FIG. 9 depicts a cross-sectional view of a glass substrate with a through-glass via with a surface treatment and without an adhesion layer in accordance with some embodiments of the present principles.

After the above surface treatment processes have been completed, the actual bonding may be to an adhesion layer or to another material. In block 316, optionally, an adhesion layer 504 may be formed on the first diffusion layer 402 as depicted in a cross-sectional view 500 of FIG. 5. The adhesion layer 504 interacts with the dangling bonds 412 of the first diffusion layer 406 and forms a high strength bond to the first diffusion layer 406 and subsequently to the underlying first material 402. In block 318, a second material 502 is then formed on the adhesion layer 504, bonding the second material 502 to the adhesion layer 504 and subsequently to the underlying first material 402. In the alternative, block 318 may be performed after the surface treatment processes have been completed as depicted in a cross-sectional view 600 of FIG. 6. The second material 502 is formed directly on the first diffusion layer 406 and interacts with the dangling bonds 412 forming a high strength bond to the first diffusion layer 406 and subsequently to the underlying first material 402. In such cases, for example, the first material 402 may be a glass substrate and the second material 502 may be a metal seed layer for a through-glass via. In a cross-sectional view 800 of FIG. 8, a TGV 804 is depicted with a glass core 802 that has undergone the above surface treatment to the glass core 802 to form a first diffusion layer 406 on walls 806 of the TGV and to form an adhesion layer 504 on the first diffusion layer 406. A second material 502 has then been deposited to fill the TGV. In a cross-sectional view 900 of FIG. 9, a TGV 804 is depicted with a glass core 802 that has undergone the above surface treatment to the glass core 802 to form a first diffusion layer 406 on walls 806 of the TGV. A second material 502 has then been deposited directly on the first diffusion layer 406 (no adhesion layer used) to fill the TGV.

Figure 7:
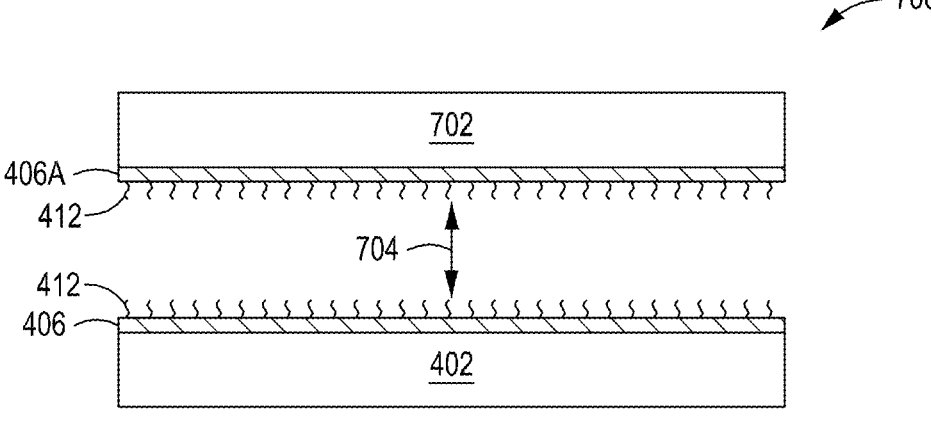
FIG. 7 depicts a cross-sectional view of two treated surfaces being bonded together in accordance with some embodiments of the present principles.
Figure 10:
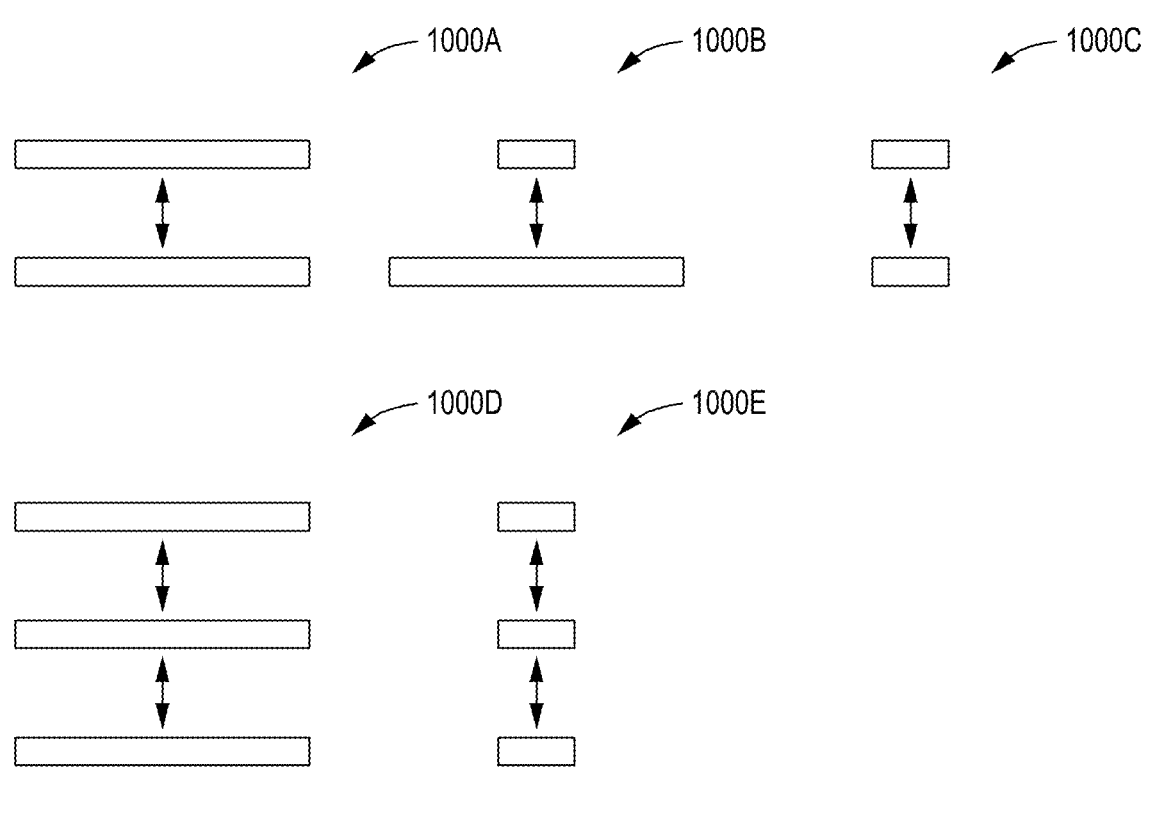
FIG. 10 depicts a cross-sectional view of different treated surfaces that can be bonded together in accordance with some embodiments of the present principles.

In an alternative application, after the above surface treatment processes have completed, the bonding may be to another material that has undergone the same surface treatment to bond 704 a first diffusion layer 406 to a second diffusion layer 406A as depicted in a cross-sectional view 700 of FIG. 7. In block 320, the prior blocks 308-314 (at least as blocks 302-306 are optional) are repeated on a third material 702 that may be different from the first material 402 or the same as the first material 402. In block 322, the first diffusion layer 406 of the first material 402 is bonded directly to the second diffusion layer 406A of the third material 702. In such cases, for example, the first material 402 may be a substrate or die and the third material 702 may be a substrate or die such that substrate-to-substrate bonding (see, e.g., view 1000A), die-to-substrate bonding (see, e.g., view 1000B), or die-to-die bonding (see, e.g., view 1000C), may occur in processes such as hybrid bonding and the like as depicted in the respective views of FIG. 10. The surface treatment process can also be extended for substrate stacks (see, e.g., view 1000D) and die stacks (see, e.g., view 1000E) as depicted in respective views of FIG. 10.

Figure 11:
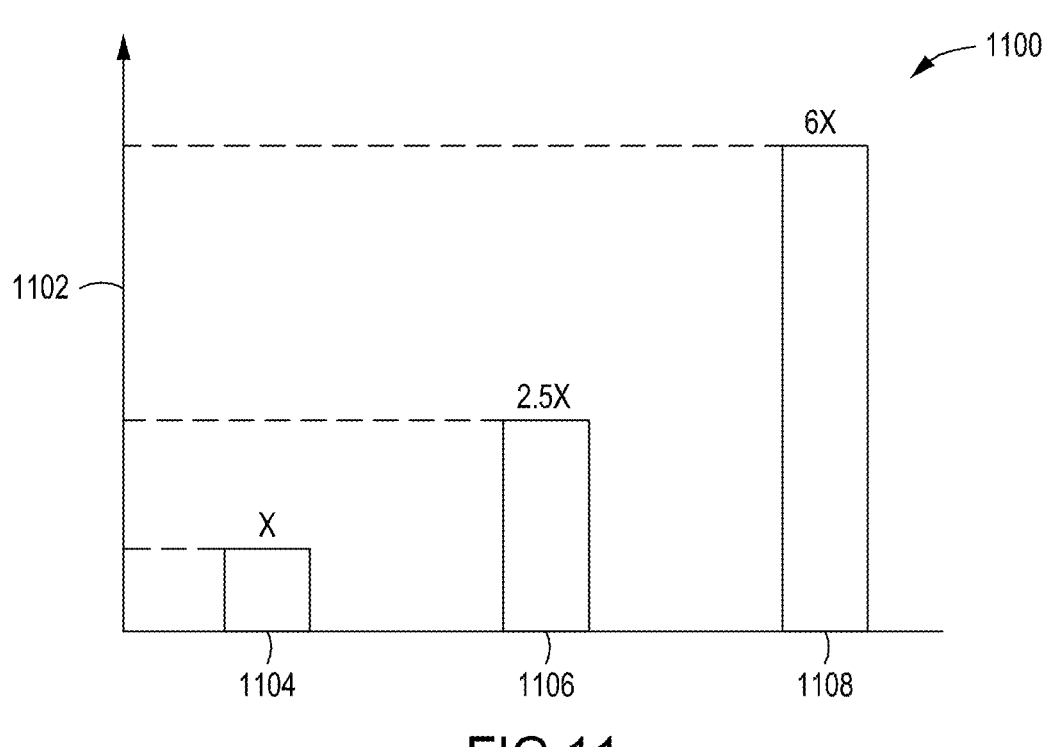
FIG. 11 depicts a graph of the bonding strength of the present method compared to other processes in accordance with some embodiments of the present principles.

Parameters such as pressure, temperature, duration, and the like of the above surface treatment (block 308 to block 314) may be adjusted based on the material type and also the diffusion layer material type. The above surface treatment (block 308 to block 314) can be completed at a temperature of less than approximately 150 degrees Celsius, preserving the low thermal budgets of semiconductor structures. As depicted in a graph 1100 of FIG. 11, the surface treatment yields bonding strengths of approximately 6 times that of traditional processes. The left axis 1102 represents increasing bonding strength in the upward direction. Bar 1104 represents traditional bonding processes. Bar 1106 represents bonding processes without the third treatment process of the present methods. Bar 1108 represents the present methods performing all three of the treatment processes.

Figure 12:
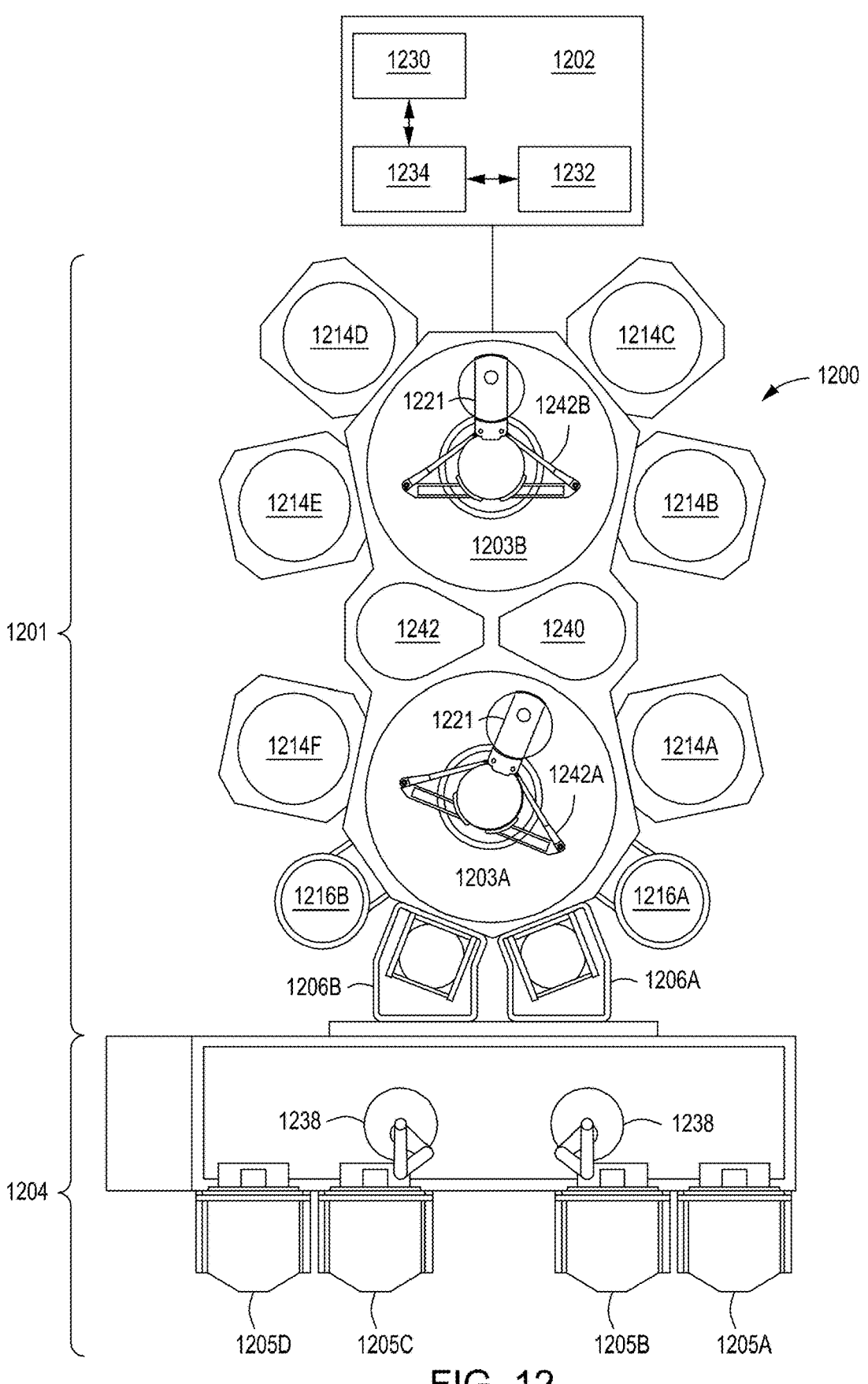
FIG. 12 depicts a top schematic view of an integrated tool in accordance with some embodiments of the present principles.
Figure 13:
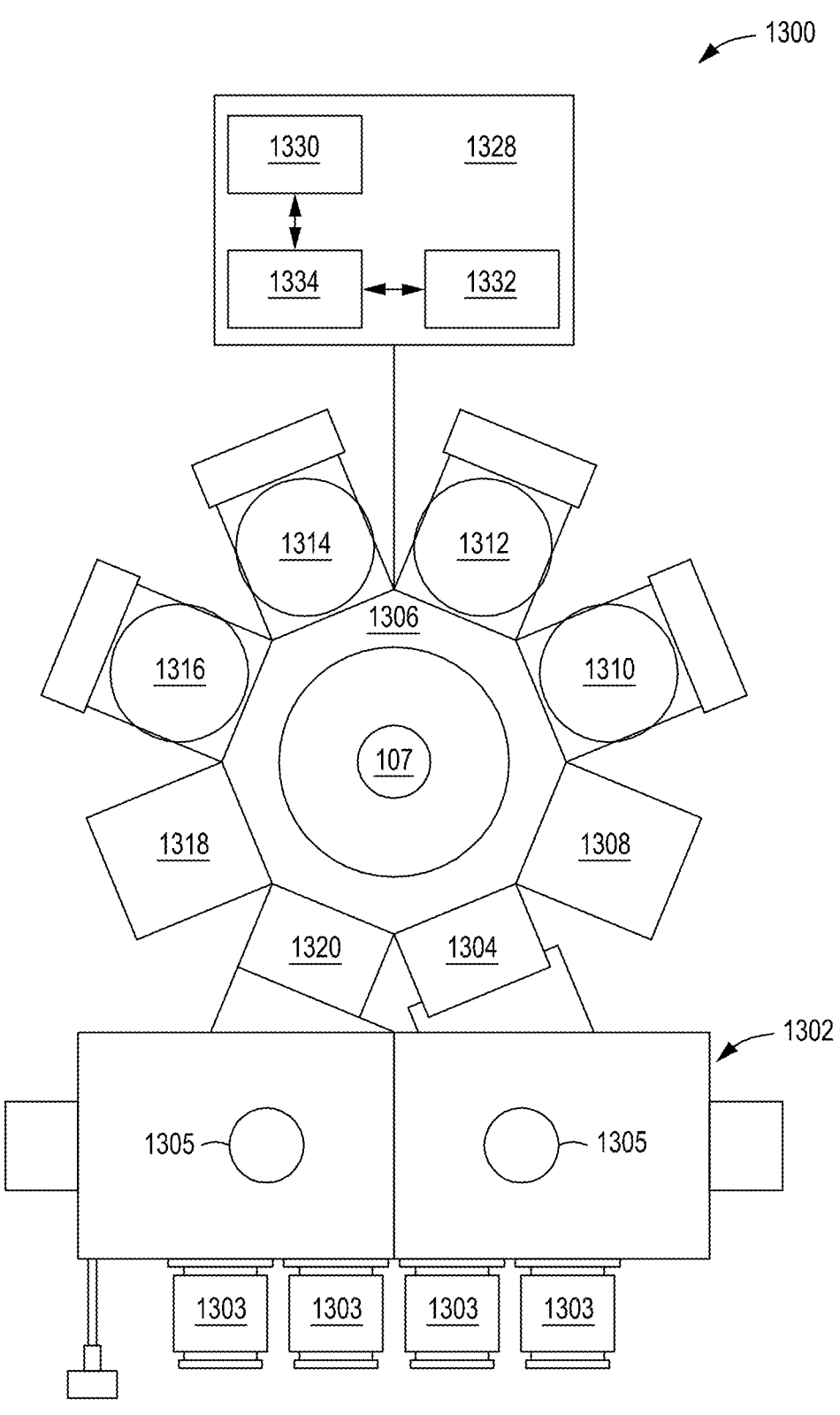
FIG. 13 depicts a top schematic view of another integrated tool in accordance with some embodiments of the present principles.

The methods described herein may be performed in a specialized chamber (e.g., see FIG. 1), individual process chambers that may be provided in a standalone configuration, or as part of a cluster tool, for example, the integrated tool 1200 (i.e., cluster tool) described below with respect to FIG. 12 and the integrated tool 1300 described below with respect to FIG. 13. The advantage of using an integrated tool 1200 is that there is no vacuum break between chambers and, therefore, no requirement to degas and pre-clean a substrate before treatment in a chamber. For example, in some embodiments the inventive methods discussed above may advantageously be performed in an integrated tool such that there are limited or no vacuum breaks between processes, limiting or preventing contamination of the substrate such as oxidation and the like. The integrated tool 1200 includes a vacuum-tight processing platform 1201, a factory interface 1204, and a system controller 1202. The processing platform 1201 comprises multiple processing chambers, such as 1214A, 1213B, 1214C, 1214D, 1214E, and 1214F operatively coupled to a vacuum substrate transfer chamber (transfer chambers 1203A, 1203B). The factory interface 1204 is operatively coupled to the transfer chamber 1203A by one or more load lock chambers (two load lock chambers, such as 1206A and 1206B shown in FIG. 12).

In some embodiments, the factory interface 1204 comprises at least one docking station 1207, at least one factory interface robot 1238 to facilitate the transfer of the semiconductor substrates. The docking station 1207 is configured to accept one or more front opening unified pod (FOUP). Four FOUPS, such as 1205A, 1205B, 1205C, and 1205D are shown in the embodiment of FIG. 12. The factory interface robot 1238 is configured to transfer the substrates from the factory interface 1204 to the processing platform 1201 through the load lock chambers, such as 1206A and 1206B. Each of the load lock chambers 1206A and 1206B have a first port coupled to the factory interface 1204 and a second port coupled to the transfer chamber 1203A. The load lock chamber 1206A and 1206B are coupled to a pressure control system (not shown) which pumps down and vents the load lock chambers 1206A and 1206B to facilitate passing the substrates between the vacuum environment of the transfer chamber 1203A and the substantially ambient (e.g., atmospheric) environment of the factory interface 1204. The transfer chambers 1203A, 1203B have vacuum robots 1242A, 1242B disposed in the respective transfer chambers 1203A, 1203B. The vacuum robot 1242A is capable of transferring substrates 1221 between the load lock chamber 1206A, 1206B, the processing chambers 1214A and 1214F and a cooldown station 1240 or a pre-dean station 1242. The vacuum robot 1242B is capable of transferring substrates 1221 between the cooldown station 1240 or pre-dean station 1242 and the processing chambers 1214B, 1214C, 1214D, and 1214E.

In some embodiments, the processing chambers 1214A, 1214B, 1214C, 1214D, 1214E, and 1214F are coupled to the transfer chambers 1203A, 1203B. The processing chambers 1214A, 1214B, 1214C, 1214D, 1214E, and 1214F may comprise, for example, an atomic layer deposition (ALD) process chamber, a physical vapor deposition (PVD) process chamber, chemical vapor deposition (CVD) chambers, annealing chambers, or the like. The chambers may include any chambers suitable to perform all or portions of the methods described herein, as discussed above. In some embodiments, one or more optional service chambers (shown as 1216A and 1216B) may be coupled to the transfer chamber 1203A. The service chambers 1216A and 1216B may be configured to perform other substrate processes, such as degassing, orientation, substrate metrology, cool down, and the like.

The system controller 1202 controls the operation of the integrated tool 1200 using a direct control of the process chambers 1214A, 1214B, 1214C, 1214D, 1214E, and 1214F or alternatively, by controlling the computers (or controllers) associated with the process chambers 1214A, 1214B, 1214C, 1214D, 1214E, and 1214F and the integrated tool 1200. In operation, the system controller 1202 enables data collection and feedback from the respective chambers and systems to optimize performance of the integrated tool 1200. The system controller 1202 generally includes a Central Processing Unit (CPU) 1230, a memory 1234, and a support circuit 1232. The CPU 1230 may be any form of a general-purpose computer processor that can be used in an industrial setting. The support circuit 1232 is conventionally coupled to the CPU 1230 and may comprise a cache, clock circuits, input/output subsystems, power supplies, and the like. Software routines, such as a method as described above may be stored in the memory 1234 and, when executed by the CPU 1230, transform the CPU 1230 into a specific purpose computer (system controller) 1202. The software routines may also be stored and/or executed by a second controller (not shown) that is located remotely from the integrated tool 1200.

Another integrated tool 1300 may also be used to perform the above-described methods. In some embodiments, the integrated tool 1300 may be configured for processing workpieces that include high aspect ratio features, such as high aspect ratio vias (e.g., TGVs) as described herein. In some embodiments, the workpiece may be a substrate, such as a silicon or other semiconductor substrate, or an interposer such as an organic material containing interposer or glass interposer and the like. The integrated tool 1300 generally includes an EFEM 1302 for loading workpieces into the integrated tool 1300, a first load lock chamber 1304 coupled to the EFEM 1302, a transfer chamber 1306 coupled to the first load lock chamber 1304, and a plurality of other chambers coupled to the transfer chamber 1306 as described in detail below. The EFEM 1302 generally includes one or more robots 1305 that are configured to transfer workpieces from the FOUPs 1303 to at least one of the first load lock chamber 1304 or the second load lock chamber 1320.

Proceeding counterclockwise around the transfer chamber 1306 from the first load lock chamber 1304, the integrated tool 1300 includes a first dedicated degas chamber 1308, a first pre-dean chamber 1310, a first deposition chamber 1312, a second pre-clean chamber 1314, a second deposition chamber 1316, a second dedicated degas chamber 1318, and the second load lock chamber 1320. In some embodiments, the first deposition chamber 1312 and the second deposition chamber 1316 may be PVD chambers, ALD chamber, CVD chambers, or some combination thereof. In some embodiments, the transfer chamber 1306 and each chamber coupled to the transfer chamber 1306 are maintained at a vacuum state. As used herein, the term "vacuum" may refer to pressures less than 760 Torr and will typically be maintained at pressures near $10^{-5}$ Torr (i.e., ~$10^{-3}$ Pa). However, some high-vacuum systems may operate below near $10^{-7}$ Torr (i.e., ~$10^{-5}$ Pa). In some embodiments, the vacuum is created using a rough pump and/or a turbomolecular pump coupled to the transfer chamber 1306 and to each of the one or more process chambers (e.g., process chambers 1308-1318). However, other types of vacuum pumps may also be used.

The system controller 1328 controls the operation of the integrated tool 1300 using a direct control of the process chambers or alternatively, by controlling the computers (or controllers) associated with the process chambers and the integrated tool 1300. In operation, the system controller 1328 enables data collection and feedback from the respective chambers and systems to optimize performance of the integrated tool 1300. The system controller 1328 generally includes a Central Processing Unit (CPU) 1330, a memory 1334, and a support circuit 1332. The CPU 1330 may be any form of a general-purpose computer processor that can be used in an industrial setting. The support circuit 1332 is conventionally coupled to the CPU 1330 and may comprise a cache, clock circuits, input/output subsystems, power supplies, and the like. Software routines, such as a method as described above may be stored in the memory 1334 and, when executed by the CPU 1330, transform the CPU 1330 into a specific purpose computer (system controller) 1328. The software routines may also be stored and/or executed by a second controller (not shown) that is located remotely from the integrated tool 1300.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for preparing a surface for bonding, comprising:

performing a first treatment process on a first surface of a first material using a first plasma process to promote diffusion into the first surface of a first diffusion layer deposited after the first treatment process, wherein the first treatment process uses capacitively coupled plasma (CCP) or a combination including both CCP and inductively coupled plasma (ICP) simultaneously;

forming the first diffusion layer on the first surface of the first material;

performing a second treatment process using a second plasma process to increase diffusion of the first diffusion layer into the first surface of the first material, wherein the second treatment process uses CCP; and performing a third treatment process using a third plasma process to form dangling bonds on the first diffusion layer, wherein the third treatment process uses ICP or a combination including both CCP and ICP simultaneously.

2. The method of claim 1, wherein the first material is rotated about a vertical axis during the first treatment process or the third treatment process.

3. The method of claim 1, wherein the first plasma process forms plasma using an argon-based gas, a nitrogen-based gas, an oxygen-based gas, a hydrogen-based gas, a fluorocarbon ($C_xF_y$)-based gas, or nitrogen fluoride ($NF_x$)-based gas.

4. The method of claim 1, wherein the first treatment process, the second treatment process, and the third treatment process each have a duration of approximately 30 seconds to approximately 5 minutes.

5. The method of claim 1, wherein the first treatment process uses approximately 1 kW to approximately 3 kW power when CCP is used and approximately 100 W to approximately 10 kW source power when ICP is used.

6. The method of claim 1, wherein the first diffusion layer is formed using a physical vapor deposition (PVD) process, an atomic layer deposition (ALD) process, a chemical vapor deposition (CVD) process, a thermal evaporation process, or an e-beam evaporation process.

7. The method of claim 1, wherein the first diffusion layer is formed using a source power of approximately 5 kW to approximately 60 kW at a pressure of approximately 0.5 mTorr to approximately 10 mTorr.

8. The method of claim 1, wherein the first diffusion layer has a thickness of approximately 0.5 nm to approximately 5 nm.

9. The method of claim 1, wherein the first diffusion layer is a molybdenum-based material, a titanium-based material, a tantalum-based material, a cobalt-based material, a tungsten-based material, a copper-based material, a silicon-based material, a nitride-based material, a silicide-based material, or a carbide-based material.

10. The method of claim 1, wherein the second plasma process or the third plasma process forms plasma using an argon-based gas, a nitrogen-based gas, an oxygen-based gas, or a hydrogen-based gas.

11. The method of claim 1, wherein the second treatment process is performed with a power of approximately 1 kW to approximately 3 kW at a pressure of approximately 0.5 mTorr to approximately 10 mTorr.

12. The method of claim 1, wherein the third treatment process is performed with a source power of approximately 100 W to approximately 10 kW at a pressure of approximately 0.5 mTorr to approximately 20 mTorr.

13. The method of claim 1, wherein a seed layer is formed directly on the first diffusion layer after the third treatment process or an adhesion layer is first formed on the first diffusion layer after the third treatment process and then a seed layer is formed on the adhesion layer.

14. The method of claim 1, wherein the method is repeated on a second material which is then bonded to the first material with the first diffusion layer and a second diffusion layer on the second material as intermediate layers between the first material and the second material bonded together.

15. The method of claim 1, wherein the first material is a glass-based material and the method is performed on a through glass via (TGV) in the glass-based material.

16. The method of claim 1 is performed in a single process chamber, an integrated tool, or in separate process chambers.

17. A non-transitory, computer readable medium having instructions stored thereon that, when executed, cause a method for preparing a surface for bonding to be performed, the method comprising:

performing a first treatment process on a surface of a material using a first plasma process to promote diffusion into the surface of a diffusion layer deposited after the first treatment process, wherein the first treatment process uses capacitively coupled plasma (CCP) or a combination including both CCP and inductively coupled plasma (ICP) simultaneously;

forming the diffusion layer on the surface of the material;

performing a second treatment process using a second plasma process to increase diffusion of the diffusion layer into the surface of the material, wherein the second treatment process uses CCP; and performing a third treatment process using a third plasma process to form dangling bonds on the diffusion layer, wherein the third treatment process uses ICP or a combination including both CCP and ICP simultaneously.

18. The non-transitory, computer readable medium of claim 17, the method further comprising at least one of a, b, c, d, e, f, g, or h a) wherein the first plasma process forms plasma using an argon-based gas, a nitrogen-based gas, an oxygen-based gas, a hydrogen-based gas, a fluorocarbon ($C_xF_y$)-based gas, or nitrogen fluoride ($NF_x$)-based gas;

b) wherein the first treatment process, the second treatment process, and the third treatment process each have a duration of approximately 30 seconds to approximately 5 minutes;

c) wherein the first treatment process uses approximately 1 kW to approximately 3 kW power when CCP is used and approximately 100 W to approximately 10 kW source power when ICP is used;

d) wherein the diffusion layer has a thickness of approximately 0.5 nm to approximately 5 nm;

e) wherein the diffusion layer is a molybdenum-based material, a titanium-based material, a tantalum-based material, a cobalt-based material, a tungsten-based material, a copper-based material, a silicon-based material, a nitride-based material, a silicide-based material, or a carbide-based material;

f) wherein the second plasma process or the third plasma process forms plasma using an argon-based gas, a nitrogen-based gas, an oxygen-based gas, or a hydrogen-based gas;

g) wherein the second treatment process is performed with a power of approximately 1 kW to approximately 3 kW at a pressure of approximately 0.5 mTorr to approximately 10 mTorr; or h) wherein the third treatment process is performed with a source power of approximately 100 W to approximately 10 kW at a pressure of approximately 0.5 mTorr to approximately 20 mTorr.

19. An apparatus for preparing a surface for bonding, comprising:

a process chamber with a rotating substrate support, a process volume enclosed by an upper process shield, a lower process shield, and a rotatable top shield, and multiple selectable cathodes positioned on top of the process chamber which are connected to a dual-power type target power supply configured to produce RF power or DC power or pulsed DC power, wherein one cathode position is an inductively coupled plasma (ICP) source;

a dual-power power supply electrically connected to an electrode in the rotating substrate support and configured to generate capacitively coupled plasma (CCP) within the process volume;

the ICP source includes a dual-power power supply that is electrically connected to an antenna and configured to generate ICP within the process volume, wherein the antenna is positioned to be exposed to the process volume by rotating the rotatable top shield; and a controller configured to rotate the rotatable top shield to select a cathode for deposition or the antenna for ICP generation within the process volume and to perform a method including:

performing a first treatment process on a surface of a material using a first plasma process to promote diffusion into the surface of a diffusion layer deposited after the first treatment process, wherein the first treatment process uses CCP or a combination including both CCP and ICP simultaneously;

forming the diffusion layer on the surface of the material;

performing a second treatment process using a second plasma process to increase diffusion of the diffusion layer into the surface of the material, wherein the second treatment process uses CCP; and performing a third treatment process using a third plasma process to form dangling bonds on the diffusion layer, wherein the third treatment process uses ICP or a combination including both CCP and ICP simultaneously.

20. The apparatus of claim 19, wherein the dual-power power supply includes a first RF power source with a first frequency of approximately 60 MHz and a second RF power source with a second frequency of approximately 2 MHz.

* * * * *